United States Patent
Umada et al.

(10) Patent No.: US 11,732,348 B2
(45) Date of Patent: Aug. 22, 2023

(54) SURFACE TREATMENT FACILITY

(71) Applicant: JFE Steel Corporation, Tokyo (JP)

(72) Inventors: Takumi Umada, Tokyo (JP); Yukihiro Shingaki, Tokyo (JP)

(73) Assignee: JFE STEEL CORPORATION, Tokyo (JP)

( * ) Notice: Subject to any disclaimer, the term of this patent is extended or adjusted under 35 U.S.C. 154(b) by 237 days.

(21) Appl. No.: 16/979,938

(22) PCT Filed: Mar. 20, 2019

(86) PCT No.: PCT/JP2019/011774
§ 371 (c)(1),
(2) Date: Sep. 11, 2020

(87) PCT Pub. No.: WO2019/188683
PCT Pub. Date: Oct. 3, 2019

(65) Prior Publication Data
US 2021/0010129 A1 Jan. 14, 2021

(30) Foreign Application Priority Data
Mar. 30, 2018 (JP) .................................. 2018-068089

(51) Int. Cl.
*C23C 14/54* (2006.01)
*C23C 14/32* (2006.01)
*C23C 14/56* (2006.01)

(52) U.S. Cl.
CPC ............ *C23C 14/542* (2013.01); *C23C 14/32* (2013.01); *C23C 14/56* (2013.01)

(58) Field of Classification Search
CPC ....... C23C 14/542; C23C 14/32; C23C 14/56; C23C 14/228; C23C 14/54; C23C 14/562;
(Continued)

(56) References Cited

U.S. PATENT DOCUMENTS

| 5,192,585 | A | * | 3/1993 | Inokuti | .................. C21D 9/565 427/295 |
| 2001/0042513 | A1 | * | 11/2001 | Kao | .................. H01L 21/67069 118/723 MR |

(Continued)

FOREIGN PATENT DOCUMENTS

| CN | 102899629 A | 1/2013 |
| CN | 107429402 A | 12/2017 |

(Continued)

OTHER PUBLICATIONS

Extended European Search Report for European Application No. 19 776 999.5, dated Mar. 21, 2021, 8 pages.
(Continued)

*Primary Examiner* — Jennifer Wecker
*Assistant Examiner* — Patrick S Ott
(74) *Attorney, Agent, or Firm* — RatnerPrestia

(57) ABSTRACT

Provided is a surface treatment facility in which both surfaces of a material are subjected to continuous film deposition by PVD as the material is conveyed in the longitudinal direction, wherein flutter of the material subjected to coating can be suppressed. This surface treatment facility comprises a chamber configured to continuously deposit a film by PVD on both surfaces of a material as the material is conveyed in the longitudinal direction through the chamber; a conveyance mechanism for conveying the material subjected to coating; a blowing mechanism for blowing film-forming gas in the longitudinal direction on both sides of the material present in the chamber; and has an X/Y ratio within a range of 0.4 to 3.0 where X is the film-forming gas blowing speed, and Y is the conveyance speed of the material subjected to coating, and where the unit of measurement of X and Y is m/min.

8 Claims, 3 Drawing Sheets

(58) Field of Classification Search
CPC .............. C23C 14/0063; H01J 37/3244; H01J 37/32449
USPC .................. 204/298.24, 298.07; 118/718
See application file for complete search history.

(56) References Cited

U.S. PATENT DOCUMENTS

| | | |
|---|---|---|
| 2002/0020496 A1* | 2/2002 | Shinohara .............. C23C 14/562 204/298.25 |
| 2003/0180554 A1* | 9/2003 | Inokuti .................... C23C 28/04 204/192.15 |
| 2001/0154539 | 8/2004 | Feldbauer |
| 2004/0154539 A1* | 8/2004 | Feldbauer ............... C23C 14/24 118/716 |
| 2005/0112377 A1 | 5/2005 | Schuhmacher et al. |
| 2006/0006064 A1* | 1/2006 | Tepman .............. H01J 37/3423 204/298.12 |
| 2006/0048703 A1 | 3/2006 | Hartig |
| 2007/0289869 A1* | 12/2007 | Ye ....................... C23C 14/3407 204/298.12 |
| 2008/0261029 A1* | 10/2008 | Andersson ............ C23C 14/081 428/336 |
| 2013/0029161 A1 | 1/2013 | Nashiki et al. |
| 2016/0145740 A1 | 5/2016 | Nashiki et al. |
| 2018/0005800 A1 | 1/2018 | Kon |
| 2018/0087158 A1 | 3/2018 | Terashima et al. |
| 2018/0347048 A1* | 12/2018 | Buet ..................... C23C 14/562 |

FOREIGN PATENT DOCUMENTS

| | | |
|---|---|---|
| JP | 6240368 A | 2/1987 |
| JP | 01176034 A | 7/1989 |
| JP | 2005500435 A | 1/2005 |
| JP | 2008512565 A | 4/2008 |
| JP | 2013112867 A | 6/2013 |
| JP | 2015227488 A | 12/2015 |
| JP | 2016172901 A | 9/2016 |
| WO | 2016093312 A1 | 6/2016 |
| WO | 2017085412 A1 | 5/2017 |

OTHER PUBLICATIONS

Chinese Office Action with Search Report for Chinese Application No. 201980021776.2, dated Feb. 25, 2022, 8 pages.
International Search Report and Written Opinion for International Application No. PCT/JP2019/011774, dated Jun. 18, 2019, 5 pages.

* cited by examiner

SURFACE TREATMENT FACILITY

CROSS REFERENCE TO RELATED APPLICATIONS

This is the U.S. National Phase application of PCT/JP2019/011774, filed Mar. 20, 2019, which claims priority to Japanese Patent Application No. 2018-068089, filed Mar. 30, 2018, the disclosures of each of these applications being incorporated herein by reference in their entireties for all purposes.

FIELD OF THE INVENTION

The present invention relates to a surface treatment facility.

BACKGROUND OF THE INVENTION

Grain oriented electrical steel sheets are soft magnetic materials used as materials for iron cores of transformers, generators and the like. Grain oriented electrical steel sheets have a crystal structure in which the <001> orientation that is an easy magnetization axis of iron is highly-precisely aligned in the rolling direction of the steel sheet. The texture as above is formed through final annealing of a manufacturing process of a grain oriented electrical steel sheet, which final annealing allows crystal grains with the {110}<001> orientation referred to as the so-called Goss orientation to preferentially grow to an enormous size. Grain oriented electrical steel sheets as products are required to have such magnetic properties as high magnetic flux density and low iron loss.

The magnetic properties of a grain oriented electrical steel sheet are improved by applying a tensile stress (tension) to a steel sheet surface. As one conventional technique of applying a tensile stress to a steel sheet, a technique in which a forsterite coating of about 2 µm thickness is formed on a steel sheet surface and another coating of about 2 µm thickness of silicon phosphate is formed on the forsterite coating is typically used. The silicon phosphate coating having a lower thermal expansion coefficient than that of the steel sheet is formed at high temperature and cooled to room temperature, whereby a tensile stress is applied to the steel sheet using a difference in thermal expansion coefficient between the steel sheet and the silicon phosphate coating.

By smoothing the steel sheet surface of the grain oriented electrical steel sheet having undergone final annealing, the iron loss reduction owing to the tensile stress of the coating can be further increased.

Meanwhile, the forsterite coating formed on the steel sheet surface by the final annealing adheres to the steel sheet owing to the anchoring effect. Therefore, the smoothness of the steel sheet surface inevitably deteriorates.

Further, adhesion between silicon phosphate and metal is so low that the silicon phosphate coating cannot be formed directly on the steel sheet surface from which the forsterite coating has been removed and which has been smoothed.

Accordingly, techniques using a CVD method or a PVD method to form a ceramic coating composed of, for example, TiN on the steel sheet surface from which the forsterite coating has been removed and which has been smoothed are known (see Patent Literatures 1 to 2).

PATENT LITERATURES

Patent Literature 1: JP 01-176034A
Patent Literature 2: JP 62-040368A

SUMMARY OF THE INVENTION

The present inventors studied an embodiment where a coating is continuously formed by a PVD method on a coating formation-target material such as a steel sheet (grain oriented electrical steel sheet having no forsterite coating and having undergone final annealing) that is conveyed. More specifically, the present inventors studied the embodiment where coatings are simultaneously formed on both surfaces of the coating formation-target material conveyed in a longitudinal direction in a chamber. In the foregoing embodiment, targets for use in the PVD method were disposed on both surface sides of the coating formation-target material conveyed in a longitudinal direction, and a coating forming gas was blown on both surface sides of the coating formation-target material in a longitudinal direction.

As a result of the study, it was found that in the foregoing embodiment, the coating formation-target material may sometimes flap. When the coating formation-target material flaps while being conveyed, the coating formation-target material may possibly touch an interior member or another part of a chamber so as to be broken.

In addition, in the foregoing embodiment, when the coating formation-target material flaps, the coating thickness difference between the formed coatings (given that one surface of the coating formation-target material is "surface A" while the other surface is "surface B," the difference between the coating thickness on the surface A and the coating thickness on the surface B) may become large.

The coating thickness difference is a problem peculiar to a PVD method. That is, in a CVD method, since the reaction (coating formation) proceeds only on a surface of a coating formation-target material heated to high temperature, even if the coating formation-target material flaps, the coatings formed thereon would hardly have a coating thickness difference.

On the other hand, in a PVD method (ion plating method, in particular), metal ions (such as Ti ions) are flown and spread from a target (solid object of metal or another substance to be sputtered) to adhere to a coating formation-target material that is negatively charged, whereby a coating is formed. Hence, when the target is far from the coating formation-target material, the coating would be thin while the coating formation area becomes large. On the contrary, when the target is close to the coating formation-target material, the coating would be thick while the coating formation area becomes narrow. Accordingly, the formed coatings would have a large coating thickness difference.

When the coating formation-target material is a grain oriented electrical steel sheet having no forsterite coating and having undergone final annealing, a large difference in coating thickness between the ceramic coatings formed on its surfaces may lead to deterioration of magnetic properties such as iron loss.

The present invention has been made in view of the above and aims at providing a surface treatment facility for continuously forming coatings by a PVD method on both surfaces of a coating formation-target material conveyed in a longitudinal direction, wherein the coating formation-target material can be prevented from flapping.

The present inventors have made an intensive study and as a result found that when the structure described below is employed, the foregoing object is achieved. The invention has been thus completed.

Specifically, the present invention according to exemplary embodiments provides the following [1] to [5].

[1] A surface treatment facility comprising a chamber and continuously forming coatings by a physical vapor deposition method on both surfaces of a coating formation-target material conveyed in the chamber in a longitudinal direction, the facility further comprising: a conveyance mechanism for conveying the coating formation-target material; and a blowing mechanism for blowing a coating forming gas in a longitudinal direction on both surface sides of the coating formation-target material in the chamber, wherein, when a blowing speed of the coating forming gas is X in a unit of m/minute while a conveyance speed of the coating formation-target material is Y in a unit of m/minute, a ratio expressed by X/Y falls within a range of 0.4 to 3.0.

[2] The surface treatment facility according to [1], wherein the ratio expressed by X/Y falls within a range of 0.6 to 2.0.

[3] The surface treatment facility according to [1] or [2], wherein the ratio expressed by X/Y falls within a range of 0.8 to 1.5.

[4] The surface treatment facility according to any one of [1] to [3], wherein the coating formation-target material is a metal strip.

[5] The surface treatment facility according to any one of [1] to [4], wherein the coating formation-target material is a grain oriented electrical steel sheet having no forsterite coating.

According to an embodiment of the present invention, a surface treatment facility for continuously forming coatings by a PVD method on both surfaces of a coating formation-target material conveyed in a longitudinal direction, wherein the coating formation-target material can be prevented from flapping can be provided. By suppressing the flapping of the coating formation-target material, coatings with an even coating thickness can be formed.

DETAILED DESCRIPTION OF EMBODIMENTS OF THE INVENTION

[Surface Treatment Facility]

Concisely, a surface treatment facility according to embodiments of the present invention includes a chamber and continuously forms coatings by a PVD method on both surfaces of a coating formation-target material conveyed in a longitudinal direction in the chamber.

The surface treatment facility according to embodiments of the present invention further includes a conveyance mechanism for conveying the coating formation-target material and a blowing mechanism for blowing a coating forming gas in a longitudinal direction on both surface sides of the coating formation-target material in the chamber, and, when a blowing speed of the coating forming gas is X in the unit of m/minute while a conveyance speed of the coating formation-target material is Y in the unit of m/minute, a ratio expressed by X/Y falls within the range of 0.4 to 3.0. With this configuration, the coating formation-target material is prevented from flapping.

Below, an embodiment of the present invention is explained with reference to the drawings. However, the present invention should not be construed as being limited to the following embodiment.

Figure 1:
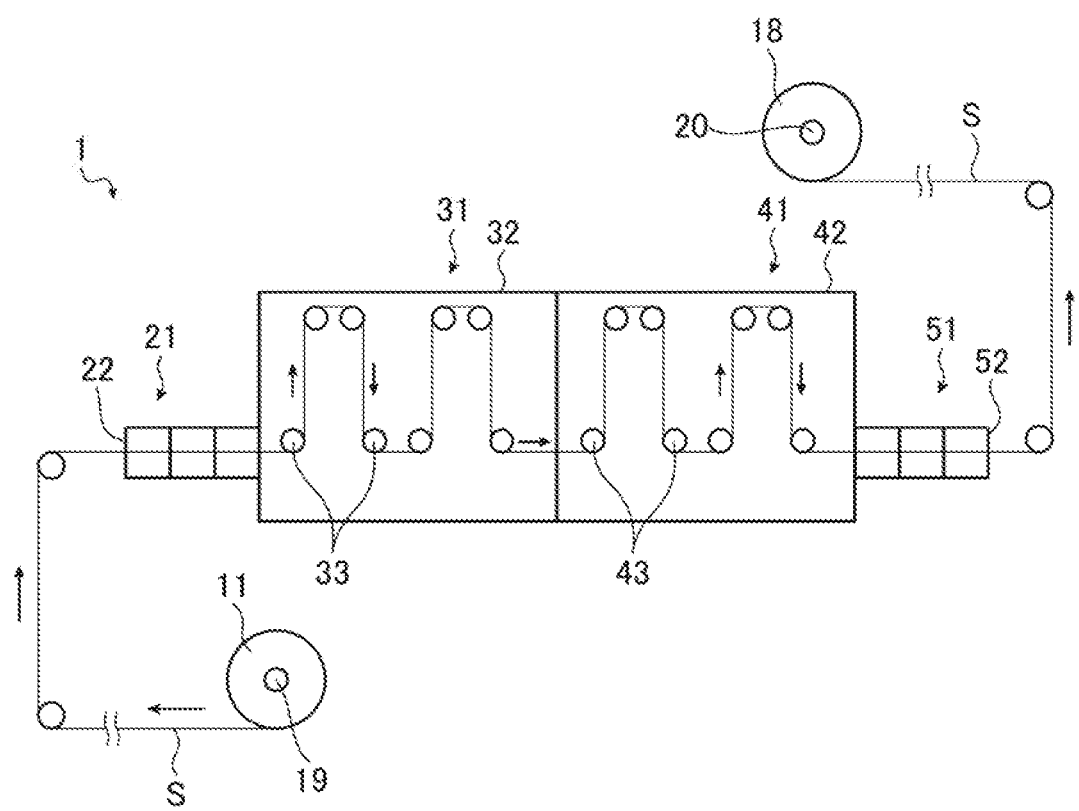
FIG. 1 is a schematic view schematically showing a surface treatment facility.

First, with reference to FIG. 1, the configuration of a surface treatment facility 1 is described. Thereafter, a coating formation facility 41 provided to the surface treatment facility 1 will be described in detail.

FIG. 1 is a schematic view schematically showing the surface treatment facility 1. The surface treatment facility 1 includes a payoff reel 19. A coil 11 before conveyance formed from a coating formation-target material S is hung on the payoff reel 19. The coating formation-target material S pulled out from the payoff reel 19 is conveyed through various sections of the surface treatment facility 1 and then again wound by a winding reel 20 to form a coil 18 after conveyance.

The payoff reel 19, the winding reel 20 and other components such as rolls provided to the various sections (including rolls 33 and rolls 43 to be described later) constitute the conveyance mechanism conveying the coating formation-target material S. The conveyance speed of the coating formation-target material S is controlled by the driving of the various sections constituting the conveyance mechanism.

The surface treatment facility 1 includes, in order of a conveyance direction of the coating formation-target material S, an entry decompression facility 21 having multistage entry decompression chambers 22, a pretreatment facility 31 having a pretreatment chamber 32, a coating formation facility 41 having a coating formation chamber 42 as a chamber, and an exit decompression facility 51 having multistage exit decompression chambers 52. The coating formation-target material S is conveyed in an air atmosphere except in the entry decompression chambers 22, the pretreatment chamber 32, the coating formation chamber 42 and the exit decompression chambers 52.

The coating formation-target material S is not particularly limited in composition or material, and examples of the coating formation-target material S include a metal strip, a film and a semiconductor. When the coating formation-target material S is a metal strip made from a steel sheet or another metal, the coating formation-target material S is conveyed, for example, in a rolling direction.

Described below is an exemplary case where the coating formation-target material S is a grain oriented electrical steel sheet having undergone final annealing as a type of metal strip. The coil 11 before conveyance formed from a grain oriented electrical steel sheet S having undergone final annealing (hereinafter also simply called "steel sheet S") is hung on the payoff reel 19.

Typically, a grain oriented electrical steel sheet having undergone final annealing has a forsterite coating.

When the steel sheet S has a forsterite coating, the steel sheet S is subjected to polishing process in, for instance, a polishing facility (not shown) to have the forsterite coating removed before the steel sheet S is introduced into the entry decompression chambers 22 of the entry decompression facility 21. When the steel sheet S has no forsterite coating or another oxide coating, on the other hand, the steel sheet S is introduced into the entry decompression chambers 22 of the entry decompression facility 21 without polishing process.

The internal pressure in the multistage entry decompression chambers 22 is reduced stepwise toward the pretreatment chamber 32. Thus, the pressure applied to the steel sheet S (grain oriented electrical steel sheet having no forsterite coating) that is introduced into the entry decompression chambers 22 approaches the internal pressure in the pretreatment chamber 32 and the coating formation chamber 42 from the atmospheric pressure. The number of the stages of the entry decompression chambers 22 is preferably at least three.

As shown in FIG. 1, the steel sheet S that has passed through the entry decompression chambers 22 is introduced into the pretreatment chamber 32. In the pretreatment chamber 32, the steel sheet S is stretched over a plurality of rolls 33 and is conveyed. The steel sheet S being conveyed is subjected to pretreatment under a reduced pressure condition. Impurities such as oxides adhering to a surface of the steel sheet S are removed by the pretreatment. In this manner, adhesion of a coating (e.g., nitride coating) to the steel sheet S is remarkably improved. Therefore, although not essential, it is preferable to provide the pretreatment facility 31.

A favorable method of the pretreatment is ion sputtering. In the case of ion sputtering, as ion species for use, ions of inert gases such as argon and nitrogen and ions of metals such as Ti and Cr are preferably used.

The pressure in the pretreatment chamber 32 is reduced, and the internal pressure in the pretreatment chamber 32 is preferably 0.0001 to 1 Pa for the sake of increasing the mean free path of sputtering ions. A bias voltage of −100 to −1000 V is preferably applied with the steel sheet S serving as the cathode.

The steel sheet S having undergone the pretreatment is introduced into the coating formation chamber 42 of the coating formation facility 41. A coating is formed on a surface of the steel sheet S being conveyed through the coating formation chamber 42 under a reduced pressure condition. The coating formation facility 41 and the coating formation chamber 42 will be described later in detail.

The steel sheet S on which the coating has been formed is introduced into the exit decompression chambers 52 of the exit decompression facility 51. The internal pressure in the multistage exit decompression chambers 52 is increased stepwise with distance away from the coating formation chamber 42. Thus, the pressure applied to the steel sheet S returns from the internal pressure in the pretreatment chamber 32 and the coating formation chamber 42 to the atmospheric pressure. The number of the stages of the exit decompression chambers 52 is preferably at least three.

The steel sheet S that has exited from the exit decompression facility 51 is wound around the winding reel 20 to form a coil 18 after conveyance. Thereafter, a known tensile insulating coating may be formed on the steel sheet S or stress relief annealing may be performed on the steel sheet S.

<Coating Formation Facility>

Next, the coating formation facility 41 is described in further detail with reference to FIGS. 2 to 4.

Figure 2:
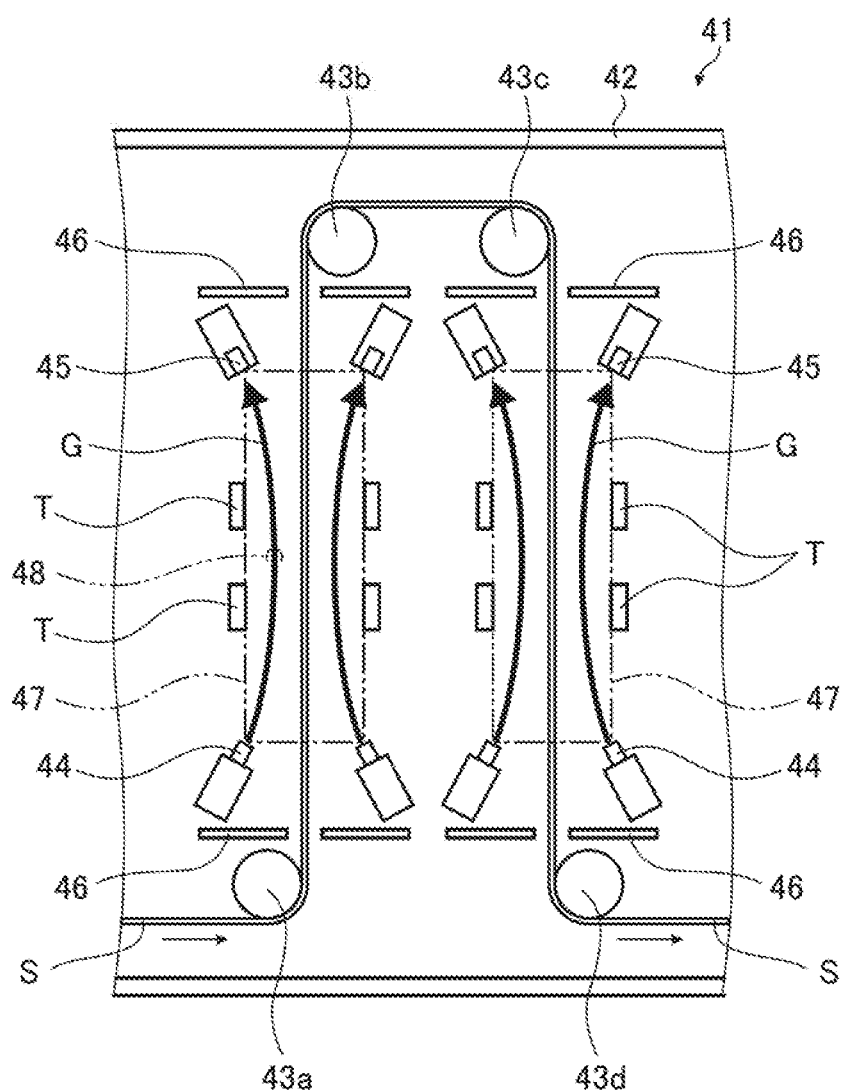
FIG. 2 is an enlarged cross-sectional view showing a coating formation chamber of a coating formation facility.

FIG. 2 is an enlarged cross-sectional view showing the coating formation chamber 42 of the coating formation facility 41. The coating formation chamber 42 of the coating formation facility 41 has a decompression space therein as a result of exhausting (suctioning) through suction portions 45 to be described later. The steel sheet S is conveyed through the decompression space in the coating formation chamber 42 in a direction of arrows shown in FIG. 2 (also called conveyance direction).

In FIG. 2, the steel sheet S conveyed in the coating formation chamber 42 is stretched over a roll 43a, a roll 43b, a roll 43c and a roll 43d (hereinafter, also collectively called "rolls 43") in order of the conveyance direction. The steel sheet S turns by 90 degrees when passing each of the rolls. In this manner, the steel sheet S is conveyed in a longitudinal direction (vertical direction), for example, between the roll 43a and the roll 43b and between the roll 43c and the roll 43d. Here, the vertical direction is a direction perpendicular to a horizontal plane or a level plane.

When the steel sheet S is conveyed in a longitudinal direction, normally, there is a concern that the steel sheet S deforms due to gravity. However, as described later, since the coating formation temperature in a PVD method is about 600° C. at the highest, the Young's modulus of the steel sheet S does not largely decrease, and hence the steel sheet S hardly deforms.

In a case where a height by which the steel sheet S is brought up in a longitudinal direction (e.g., a distance between the roll 43a and the roll 43b in FIG. 2) is about 50 m, the steel sheet S hardly deforms. Accordingly, the height by which the steel sheet S is brought up in a longitudinal direction is preferably not more than 50 m. Meanwhile, this height is preferably not less than 1 m taking into account the distance required to form a coating.

In the coating formation chamber 42, there may be a region in which the steel sheet S is conveyed in a lateral direction (horizontal direction) such as a region between the roll 43b and the roll 43c.

As shown in FIG. 2, in the coating formation chamber 42, targets T for use in a Physical Vapor Deposition (PVD) method are disposed on each surface side of the steel sheet S conveyed in a longitudinal direction. The targets T are held by holders that are not shown.

In the example shown in FIG. 2, two rows of the targets T are arranged on one surface side of the steel sheet S each between the roll 43a and the roll 43b and between the roll 43c and the roll 43d. However, this is not the sole case. Meanwhile, when the number of the rows of the targets T is too large, the coating formation chamber 42 becomes too long, or another problem arises. Therefore, the number of the rows is preferably about 80 or less.

The number of the targets T in each row (number of the targets T disposed in a width direction of the steel sheet S) will be described. Reference should be made to FIGS. 3 and 4.

Figure 3:
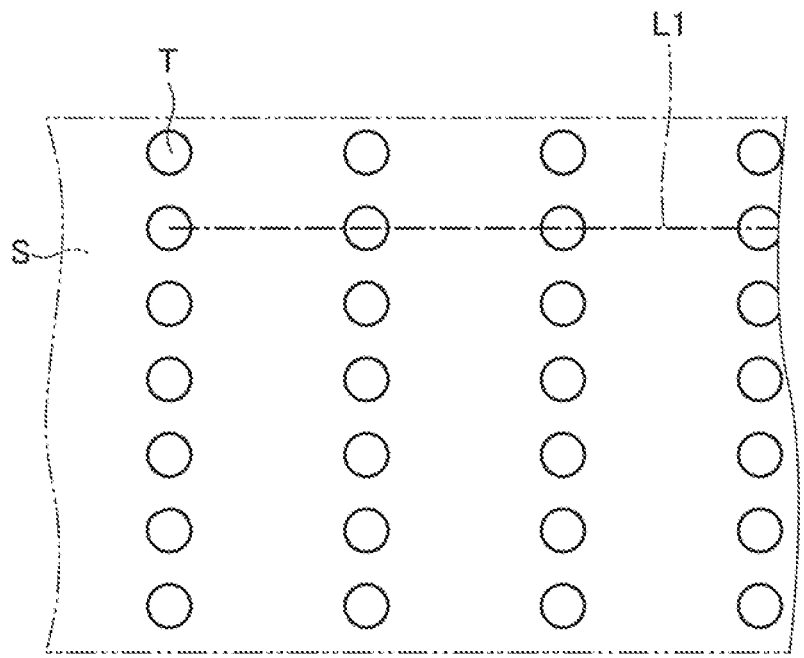
FIG. 3 is a schematic view showing an arrangement of targets.

FIG. 3 is a schematic view showing an arrangement of the targets T. The number of the targets T in each row is not particularly limited and is appropriately set according to a length in the width direction of the steel sheet S. For instance, as shown in FIG. 3, seven targets T may be disposed in each row. In FIG. 3, the targets T are linearly arranged along the conveyance direction of the steel sheet S as with a virtual line L1.

Figure 4:
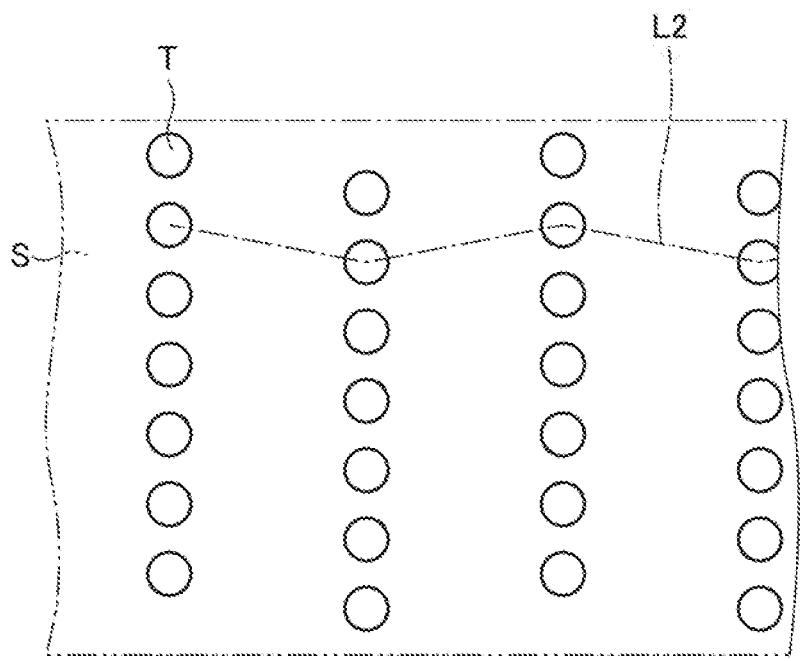
FIG. 4 is a schematic view showing another arrangement of the targets.

FIG. 4 is a schematic view showing another arrangement of the targets T. As shown in FIG. 4, the targets T may be arranged in a staggered fashion (arranged in a zigzag manner) along the conveyance direction of the steel sheet S as with a virtual line L2. This arrangement is preferable since a coating is formed using the targets T without a disproportion in the width direction of the steel sheet S.

The description of FIG. 2 is now resumed. As shown in FIG. 2, a jetting port 44 for jetting a coating forming gas G is provided on each surface side of the steel sheet S conveyed in a longitudinal direction. The coating forming gas G is a gas for use in coating formation such as nitrogen gas or TiCl$_4$ gas.

Jetting ports 44 are situated on an upstream side or a downstream side of the targets T. For instance, referring to FIG. 2, the jetting ports 44 between the roll 43a and the roll 43b are situated on an upstream side of the targets T in the conveyance direction of the steel sheet S. In the meantime, the jetting ports 44 between the roll 43c and the roll 43d are situated on a downstream side of the targets T in the conveyance direction of the steel sheet S.

Each of the jetting ports 44 is connected to a jetting device that is not shown and jets the coating forming gas G toward a region between the targets T and the steel sheet S opposing to the targets T.

A suction portion 45 is disposed on each surface side of the steel sheet S to correspond to the jetting port 44. The suction ports 45 are situated on an upstream side or a downstream side of the targets T as with the jetting ports 44. Meanwhile, the suction ports 45 are situated on the opposite side to the jetting ports 44 across the targets T. For instance, referring to FIG. 2, the suction ports 45 between the roll 43a and the roll 43b are situated on a downstream side of the targets T. In the meantime, the suction ports 45 between the roll 43c and the roll 43d are situated on a downstream side of the targets T.

The suction ports 45 are connected to a suction pump that is not shown and exhaust (suction) the interior of the coating formation chamber 42 to achieve a decompression space.

In addition, each of the suction ports 45 is disposed to face a region between the targets T and the steel sheet S opposing to the targets T and suctions the coating forming gas G jetted from the jetting port 44.

The jetting ports 44 and the suction ports 45 constitute the blowing mechanism blowing the coating forming gas G in a longitudinal direction on each surface side of the steel sheet S.

By adjusting a jetting amount of the coating forming gas G from the jetting ports 44 and/or a suction amount through the suction ports 45, the blowing speed of the coating forming gas G is controlled.

The coating forming gas G jetted from the jetting ports 44 (at least partly) passes between the targets T and the steel sheet S and is suctioned by the corresponding suction ports 45. Taking into consideration that the coating forming gas G may not sufficiently reach the steel sheet S when the exhaust (suction) through the suction ports 45 is excessively strong, the suction ports 45 exhaust in such a manner that a desired internal pressure is achieved.

A space defined by tip ends of the jetting ports 44, tip ends of the suction ports 45 and the targets T is called a coating formation space 47 for convenience. Basically, a coating is formed on the steel sheet S in the coating formation space 47.

In FIG. 2, a blowing direction of the coating forming gas G between the roll 43a and the roll 43b coincides with the conveyance direction of the steel sheet S. Between the roll 43c and the roll 43d, on the other hand, a blowing direction of the coating forming gas G is opposite to the conveyance direction of the steel sheet S.

A blowing direction of the coating forming gas G may coincide with or may be opposite to the conveyance direction of the steel sheet S as above.

In the coating formation chamber 42, partition plates 46 are disposed to prevent the coating forming gas G from flowing around the rolls 43 and forming a coating on the surfaces of the rolls 43.

For instance, as shown in FIG. 2, a partition plate 46 is disposed between the roll 43a and the jetting port 44, and another partition plate 46 is also disposed between the suction port 45 and the roll 43b.

In the foregoing configuration, in the coating formation chamber 42, the steel sheet S is conveyed in a longitudinal direction, the coating forming gas G is blown on each surface side of the steel sheet S, and a coating is continuously formed by a PVD method. During the coating formation, the targets T are subjected to sputtering or arc discharge. The targets T are heated by a heater that is not shown.

To be more specific, arc discharge is generated, for example, between the targets T serving as a cathode and an anode so that the targets T are ionized. The ions (metal ions) are also used for maintaining plasma. The steel sheet S is applied with negative bias voltage and thereby attracts metal ions in plasma. For forming a coating of nitride such as TiN, a nitrogen gas is introduced as the coating forming gas G.

In this process, the blowing speed of the coating forming gas G is defined as X (unit: m/minute), and the conveyance speed of the steel sheet S as Y (unit: m/minute). When the ratio expressed by X/Y (hereinafter, also called "X/Y ratio") falls within the range of 0.4 to 3.0, the conveyed steel sheet S is prevented from flapping.

This is probably because, with the X/Y ratio falling within the foregoing range, the conveyance speed of the steel sheet S and the blowing speed of the coating forming gas G are nearly synchronized with each other, resulting in suppression of the flapping of the steel sheet S.

Suppression of the flapping of the steel sheet S would prevent, for example, the steel sheet S from touching the partition plates 46 or other members to be broken.

By suppressing the flapping of the steel sheet S, the coating thickness difference between the coatings formed by a PVD method (given that one surface of the steel sheet S is "surface A" while the other surface is "surface B," the difference between the coating thickness on the surface A and the coating thickness on the surface B) can be reduced. By reducing the coating thickness difference, deterioration in magnetic properties such as iron loss can be suppressed.

The blowing speed of the coating forming gas G is defined as the blowing speed at an intermediate position 48 in a longitudinal direction in the coating formation space 47. A means for measuring the blowing speed of the coating forming gas G is not particularly limited, and a known measurement means may be appropriately adopted.

The blowing speed of the coating forming gas G is set to be same on both surface sides of the steel sheet S.

The range of the foregoing X/Y ratio is preferably 0.6 to 2.0 and more preferably 0.8 to 1.5 because the flapping of the steel sheet S can be further suppressed.

The steel sheet S is preferably heated during the coating formation. For a means for heating the steel sheet S, since the interior of the coating formation chamber 42 is a decompression space, a burner or such devices may not be inevitably employed. However, any means may be suitably adopted without particular limitation as long as it is a means that does not require oxygen, such as induction heating (IH), electron beam irradiation, laser light, or infrared light.

A preferred PVD method is an ion plating method. The coating formation temperature is preferably 300° C. to 600° C., and the pressure (internal pressure) in the coating formation chamber 42 is preferably 0.1 to 100 Pa. During the coating formation, a bias voltage of −10 to −100 V is preferably applied with the steel sheet S serving as the cathode. When plasma is used for ionization of the raw material, the coating formation rate can be increased.

For the coating formed on the steel sheet S, a nitride coating is preferred, a metal nitride coating is more preferred, and a metal nitride coating including at least one metal selected from the group consisting of Zn, V, Cr, Mn, Fe, Co, Ni, Cu, Ti, Y, Nb, Mo, Hf, Zr, W and Ta is even more preferred. These coatings can easily have a rock salt structure, and since this structure easily matches the body-centered cubic lattice of the base iron of the steel sheet S, the adhesion of the coating can be improved.

The coating formed on the steel sheet S may be a single layer coating or a multilayer coating.

EXAMPLES

The present invention is specifically described below with reference to examples. However, the present invention should not be construed as being limited to the following examples.

<Nos. 1 to 10>

A coil 11 before conveyance (total mass of 8 t) formed from a grain oriented electrical steel sheet S (sheet thickness: 0.23 mm) having undergone final annealing was set in the surface treatment facility 1 described with reference to FIGS. 1 to 4, and a coating was formed. To be more specific, first, the steel sheet S having a forsterite coating removed by mechanical polishing was introduced into the pretreatment chamber 32, and impurities on the surface were removed by Ar ion sputtering.

Subsequently, in the coating formation chamber 42, TiN coatings (target coating thickness on one surface: 0.4 μm) were formed on the surfaces of the steel sheet S by a PVD method using the targets T. The PVD method was an ion plating method, and the coating formation temperature was 500° C. The number of the targets T in each row was three. The target T had a shape with Φ100 mm and a bight of 50 mm.

In this process, in the coating formation chamber 42, the blowing speed X (unit: m/minute) of the coating forming gas G and the conveyance speed Y (unit: m/minute) of the steel sheet S were controlled for each row so as to have the ratio of the blowing speed X/conveyance speed Y (X/Y ratio) as shown in Table 1 below.

On the exit side of the coating formation chamber 42, the thus formed TiN coatings on both surfaces (one being "surface A," and the other "surface B") of the steel sheet S were checked for their thicknesses. The coating thickness was checked through measurement of Ti intensity with X-ray fluorescence. The results are shown in Table 1 below.

Table 1 also shows the coating thickness difference (difference between the coating thickness on the surface A and the coating thickness on the surface B). When the coating thickness difference is smaller, it can be evaluated as the flapping of the steel sheet S being suppressed.

In addition, Table 1 also shows the value of "coating thickness difference/target coating thickness on one surface× 100."

Thereafter, a tensile insulation coating (coating thickness: 2 μm) made of silicon phosphate glass was formed on the surface of the steel sheet S on which the TiN coating had been formed. More specifically, a predetermined treatment solution was applied by roll coating, then dried, and subsequently baked in a nitrogen atmosphere at 850° C. for 15 seconds. Thereafter, stress relief annealing was carried out in a nitrogen atmosphere at 800° C. for 3 hours.

In this manner, a grain oriented electrical sheet sheet formed of steel sheet/TiN coating/tensile insulation coating was obtained. Of the obtained grain oriented electrical steel sheet, the iron loss $W_{17/50}$ (unit: W/kg) was measured. The results are shown in Table 1 below.

TABLE 1

| No. | Blowing speed X/ conveyance speed Y | Target coating thickness on one surface [μm] | Coating thickness on surface A [μm] | Coating thickness on surface B [μm] | Coating thickness difference [μm] | Coating thickness difference/ target coating thickness on one surface × 100 | Iron loss $W_{17/50}$ [W/kg] | Remarks |
|---|---|---|---|---|---|---|---|---|
| 1 | 3.5 | 0.4 | 0.45 | 0.36 | 0.09 | 22.5 | 0.75 | Com. Ex. |
| 2 | 3.0 | 0.4 | 0.37 | 0.42 | 0.05 | 12.5 | 0.69 | Ex |
| 3 | 2.5 | 0.4 | 0.37 | 0.41 | 0.04 | 10.0 | 0.68 | Ex |
| 4 | 2.0 | 0.4 | 0.42 | 0.39 | 0.03 | 7.5 | 0.66 | Ex |
| 5 | 1.5 | 0.4 | 0.40 | 0.39 | 0.01 | 2.5 | 0.65 | Ex |
| 6 | 1.0 | 0.4 | 0.40 | 0.40 | 0.00 | 0.0 | 0.64 | Ex |
| 7 | 0.8 | 0.4 | 0.41 | 0.39 | 0.02 | 5.0 | 0.65 | Ex |
| 8 | 0.6 | 0.4 | 0.38 | 0.41 | 0.03 | 7.5 | 0.67 | Ex |
| 9 | 0.4 | 0.4 | 0.43 | 0.38 | 0.05 | 12.5 | 0.68 | Ex |
| 10 | 0.2 | 0.4 | 0.46 | 0.36 | 0.10 | 25.0 | 0.77 | Com. Ex. |

Com. Ex.: Comparative Examples
Ex.: Example

As can be seen in Table 1 above, in Nos. 2 to 9 with the X/Y ratio falling within the range of 0.4 to 3.0, the coating thickness difference was smaller, the flapping of the steel sheet S was better suppressed, and the iron loss value was smaller than in Nos. 1 and 10 with the X/Y ratio deviating from the range of 0.4 to 3.0.

REFERENCE SIGNS LIST

1: surface treatment facility
11: coil before conveyance
18: coil after conveyance
19: payoff reel
20: winding reel
21: entry decompression facility
22: entry decompression chamber
31: pretreatment facility 32: pretreatment chamber
33: roll
41: coating formation facility
42: coating formation chamber (chamber)
43 (43a, 43b, 43c, 43d): roll
44: jetting port
45: suction port
46: partition plate
47: coating formation space
48: intermediate position
51: exit decompression facility
52: exit decompression chamber
G: coating forming gas
S: coating formation-target material, grain oriented electrical steel sheet having undergone final annealing (steel sheet)
T: target

The invention claimed is:

1. A surface treatment facility comprising a chamber and continuously forming coatings by a physical vapor deposition method on two surface sides of a coating formation-target material conveyed in the chamber in a longitudinal direction, the facility further comprising:
a conveyance mechanism configured to convey the coating formation-target material;
a blowing mechanism configured to blow a coating forming gas in the longitudinal direction on the two surface sides of the coating formation-target material in the chamber; and
2 or more and 80 or less rows of targets held by holders over each of the two surface sides of the coating formation-target material, wherein each target is subjected to sputtering or arc discharge during coating formation,
wherein, when a blowing speed of the coating forming gas is X in a unit of m/minute while a conveyance speed of the coating formation-target material is Y in a unit of m/minute, the blowing mechanism is configured to control the blowing speed X of the coating forming gas and the conveyance mechanism is configured to control the conveyance speed Y of the coating formation-target material so that a ratio expressed by X/Y falls within a range of 0.4 to 3.0,
wherein the coating formation-target material is a metal strip.

2. The surface treatment facility according to claim 1, wherein the coating formation-target material is a grain oriented electrical steel sheet having no forsterite coating.

3. The surface treatment facility according to claim 1, wherein the ratio expressed by X/Y falls within a range of 0.6 to 2.0.

4. The surface treatment facility according to claim 3, wherein the coating formation-target material is a grain oriented electrical steel sheet having no forsterite coating.

5. The surface treatment facility according to claim 1, wherein the ratio expressed by X/Y falls within a range of 0.8 to 1.5.

6. The surface treatment facility according to claim 5, wherein the coating formation-target material is a grain oriented electrical steel sheet having no forsterite coating.

7. The surface treatment facility according to claim 1, wherein the targets in each row are linearly arranged along the conveyance direction of the coating formation-target material.

8. The surface treatment facility according to claim 1, wherein the targets are arranged in a staggered fashion along the conveyance direction of the coating formation-target material.

* * * * *